(12) United States Patent
Kireev et al.

(10) Patent No.: US 7,440,483 B2
(45) Date of Patent: Oct. 21, 2008

(54) CASCADED INJECTION RESONATOR FOR COHERENT BEAM COMBINING OF LASER ARRAYS

(75) Inventors: Vassili Kireev, Sunnyvale, CA (US); Yun Liu, Oak Ridge, TN (US); Vladimir Protopopescu, Knoxville, TN (US); Yehuda Braiman, Oak Ridge, TN (US)

(73) Assignees: UT-Battelle, LLC, Oak Ridge, TN (US), part interest; University of Tennessee Research Foundation, Knoxville, TN (US), part interest ( * ) Notice: Subject to any disclaimer, the term of this patent is extended or adjusted under 35 U.S.C. 154(b) by 1 day.

(21) Appl. No.: 11/652,238

(22) Filed: Jan. 11, 2007

(65) Prior Publication Data

US 2008/0170598 A1    Jul. 17, 2008

(51) Int. Cl.
*H01S 5/00* (2006.01)
(52) U.S. Cl. .................. 372/44.01; 372/92; 372/99
(58) Field of Classification Search ............ 372/92, 372/99, 102, 44.01
See application file for complete search history.

(56) References Cited

U.S. PATENT DOCUMENTS

| 4,426,707 A | 1/1984 | Martin et al. |
| 4,649,351 A | 3/1987 | Veldkamp et al. |
| 4,813,762 A | 3/1989 | Leger et al. |
| 5,027,359 A | 6/1991 | Leger et al. |
| 6,931,034 B2 * | 8/2005 | Khazaei et al. ........... 372/9 |

OTHER PUBLICATIONS

H. Horiuchi, et al., Appl. Phys B, vol. 68, 121 (1999). Narrow bandwidth operation of high-power broad-area diode laser using cascaded phase-conjugate injection locking.
L. Bartelt-Berger et al, Appl. Opt. vol. 38, 3752 (1999), Power-scalable system of phase-locked single-mode diode lasers.
R. Waarts, et al., Appl. Phys. Lett., vol. 58, 2586 (1991), High-power, cw, diffraction-limited, GaAlAs laser diode array in an external Talbot cavity.

* cited by examiner

*Primary Examiner*—Dung T Nguyen
(74) *Attorney, Agent, or Firm*—Boyle Fredrickson, S.C.

(57) ABSTRACT

The invention provides a cascaded injection resonator for coherent beam combining of laser arrays. The resonator comprises a plurality of laser emitters arranged along at least one plane and a beam sampler for reflecting at least a portion of each laser beam that impinges on the beam sampler, the portion of each laser beam from one of the laser emitters being reflected back to another one of the laser emitters to cause a beam to be generated from the other one of the laser emitters to the beam reflector. The beam sampler also transmits a portion of each laser beam to produce a laser output beam such that a plurality of laser output beams of the same frequency are produced. An injection laser beam is directed to a first laser emitter to begin a process of generating and reflecting a laser beam from one laser emitter to another laser emitter in the plurality. A method of practicing the invention is also disclosed.

22 Claims, 4 Drawing Sheets

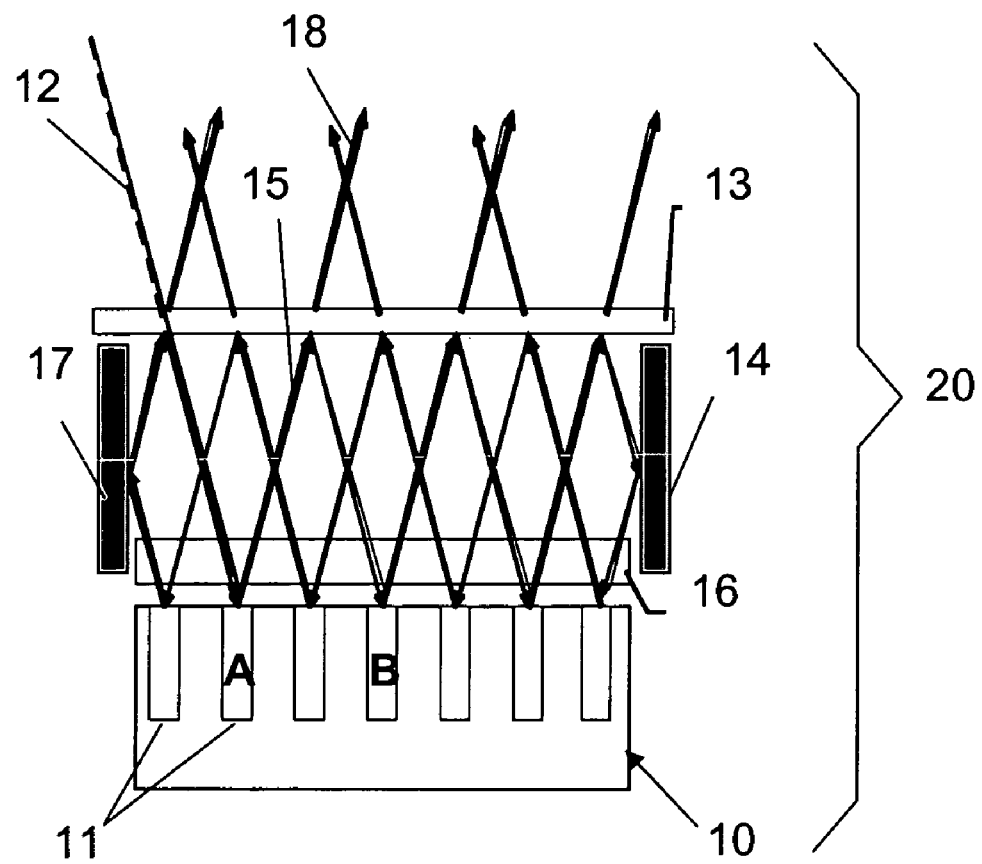
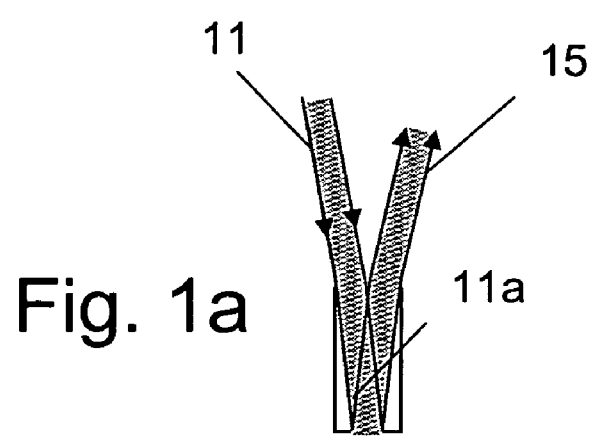
Fig. 1
Fig. 1a

CASCADED INJECTION RESONATOR FOR COHERENT BEAM COMBINING OF LASER ARRAYS

STATEMENT REGARDING FEDERALLY SPONSORED RESEARCH

This invention was made with Government support under Contract No. DE-AC05-00OR22725 awarded to UT-Battelle, LLC, by the U.S. Department of Energy. The Government has certain rights in this invention.

TECHNICAL FIELD

This invention relates to lasers arranged in laser arrays.

DESCRIPTION OF THE BACKGROUND ART

Broad area semiconductor lasers have extremely high electrical to optical wall-plug efficiency and low cost. As a result, they are very promising, lightweight, high-power light sources for a variety of applications. However, the poor spectral and beam quality of these lasers allows them to be used only as pumping sources for solid-state or fiber lasers. To improve their spectral and beam quality, research has focused on frequency stabilization and attempting to obtain coherent beam combinations of single mode lasers within laser arrays. To date, two main approaches have been developed: (i) optical injection by an external single mode single frequency laser (a seed laser) and (ii) external cavity stabilization implementing the external grating/mirror that redirects part of the output back to the semiconductor laser "internal" cavity. In principle, both approaches have the potential to obtain a single mode output from the laser array. However, notwithstanding partial achievements, a completely satisfactory solution for the frequency stabilization and coherent combination of individual beams produced by laser arrays has not been obtained. This is due to the inherent limitation of each of the two technologies, as explained below.

The scalability of the external optical injection scheme to the higher power level requires approximately one seed beam of about 25-50 mW for each Watt of output power. In order to create a coherent output beams all seed beams have to be coherent. The technical problems involve splitting the seed beam onto the array and providing the necessary power in the seed beam to produce an output beam of sufficient power.

In order to obtain a coherent output of an entire array in the external cavity design, a sufficiently strong coupling between the lasers in array is needed. To this end, about at least 80% of the emitted radiation has to be redirected back into the laser array. This results in a very low efficiency of the single mode output in the schemes with external cavity.

The technical problem is how to provide a substantial increase in the beam combining efficiency of the phase locked laser array.

SUMMARY OF THE INVENTION

The invention provides a method and circuitry for production of a single mode, single frequency, coherent output beam of increased power from a laser array.

The invention will significantly increase the efficiency of injection laser power and will also provide efficiently coupling between the lasers in the array.

One proposed configuration combines the traditional idea of single mode injection locking of a plurality of semiconductor lasers with avalanche multiplication to provide the cascaded injection.

In a method of the invention for providing a closed loop cascaded mode of operation for a plurality of laser emitters, a plurality of lasers are arranged along at least one plane and facing in one direction in an arrangement having first and second lateral ends. One portion of a laser beam from each of the laser emitters is reflected back to another one of the laser emitters to cause a beam to be generated from the other one of the laser emitters. Another portion of the laser beam from each of the laser emitters is transmitted to produce a laser output beam. An initial laser beam is injected into one of the plurality of lasers to begin a sequence of generating and reflecting a laser beam between laser emitters, such that the laser beam travels to others in the plurality of the laser emitters and such that a plurality of laser output beams having a single laser mode are generated from the respective laser emitters.

In a device of the invention, a resonator is formed by a plurality of lasers arranged along at least one plane and facing in one direction for transmitting laser beams to a beam sampler, where a portion of each beam is reflected and a portion of each beam is transmitted in a single mode of laser operation. The laser output beams can then be combined into a single mode output beam for greater power. In other embodiments either one or several high reflectivity mirrors are provided to reverse a direction of the cascaded injection, in one instance to provide a closed loop system and in other embodiments providing for an open loop system.

In still another embodiment, two injection lasers are provided and each laser emitter can be operated in two modes of operation.

The invention provides a combined output laser of greater power than the individual laser emitters with the laser operating in a single mode of laser operation having a single frequency.

Due to its compactness, the proposed embodiments have the potential to be implemented in an integrated circuit laser array chip.

The invention can be employed with semiconductor lasers or with optical fiber lasers or with solid state lasers of other types.

Other objects and advantages of the invention, besides those discussed above, will be apparent to those of ordinary skill in the art from the description of the preferred embodiments which follows. In the description, reference is made to the accompanying drawings, which form a part hereof, and which illustrate examples of the invention.

BRIEF DESCRIPTION OF THE DRAWINGS

FIG. 1 is a schematic diagram of a cascaded injection laser array of the present invention;

DETAILED DESCRIPTION OF THE PREFERRED EMBODIMENTS

Figure 2:
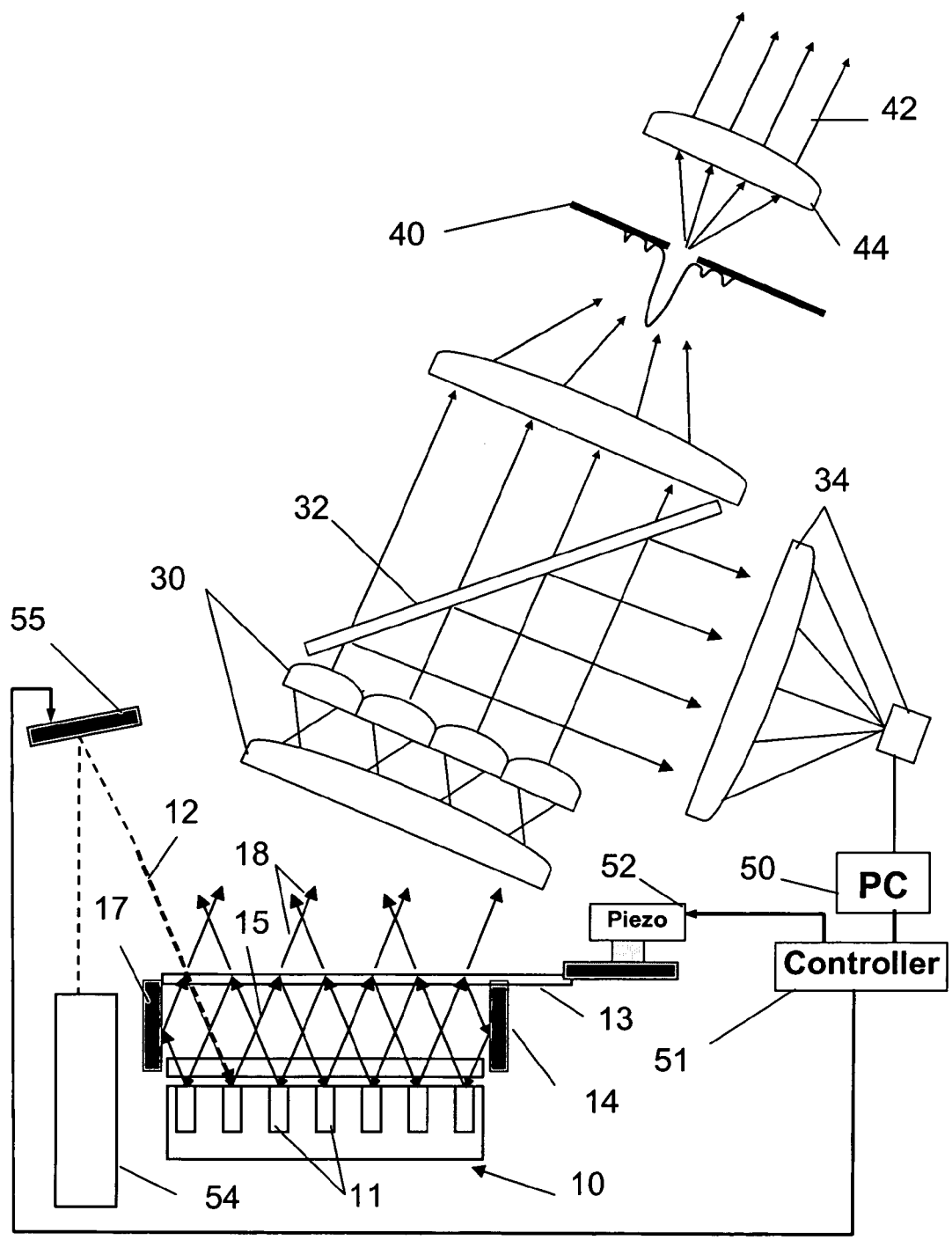
FIG. 2 is a schematic diagram of the apparatus of FIG. 1 with the addition of apparatus for combining output beams and with the addition of positioning control apparatus.

Referring to FIG. 1, a 1×N array 10 has seven (N=7) laser semiconductor emitters 11 spaced at equal intervals along at least one plane. Preferably, these elements are parts of semiconductor devices of a commercially available type. From the description that follows it will also be apparent that the principle can be applied to a M×N stacked array, which is configurable from commercially available parts. The second emitter, labeled 'A' in FIG. 1, will be injected with an external seed beam 12 indicated by a dashed line. The seed beam 12 will lock the frequency and phase as well as the spatial mode (angle) of the laser emitter A. The output of laser emitter A passes through a collimating lens 16 and then impinges on a beam sampler 13, which can be a semi-transparent element with a mirror surface such that a major portion of the laser beam 15 is transmitted through the beam sampler 13 to become an output beam 18 and a minor portion is reflected back to a cavity of another emitter B in this case. Preliminary test results indicate that an injection power in a range of 5~10% of the output power is sufficient to lock the resulting laser beam 15 into the single mode of laser operation in which the laser operates at a single frequency. This determines the ratio of transmission to reflectivity by the beam sampler 13. Such injection locking occurs in a cascaded way until the next to last emitter 11 in the array 10 is reached. The light output from this emitter 11 is reflected by a high-reflectivity mirror 14 disposed on one end of the array and standing upright and perpendicular to the array 10 and facing inwardly towards the array 10. The laser beam 15 reflected from the second last emitter is reflected back from the beam sampler to the mirror 14 and then to the last emitter 11 in the array 10.

This reverses the lateral direction of travel of the reflected laser beam 12 and it begins to travel back along the array first impinging on the beam sampler 13 and then being injected to the third-from-the-right emitter. From there it is reflected to the beam sampler 13 and then to the third-from-the-left emitter 11 and finally is reflected from the beam sampler 13 into the last emitter 11. At the left end of the array 10 is a second upright and perpendicular inwardly facing mirror 17 which reflects the beam 15 and again reverses its lateral direction of travel.

As a result, the cascaded injection array 20 operates as a closed loop device and as a resonator.

Since the coupling between the laser emitters 11 is very effective, the phase of each laser emitter 11 will be strongly influenced by all other lasers of array 10. It is estimated that about 0.1% of optical coupling is sufficient to induce phase locking between lasers 11 and collective behavior of the array 10. The individual modes of each laser are reorganized by the injection beams into collective modes of the cascaded laser array 20 formed by an assembly of the elements described above. This assembly 20 may be integrated into a single semiconductor device. Far field patterns are defined from the amplitudes-phase relationships of these collective laser array modes.

The technical difficulties related to obtaining and manipulating an array of single mode seed beams that are essential for the classical injection locking configuration are not present in the assembly 20 of FIG. 1. Moreover, the required injection power is reduced by a factor equal to the number of lasers 11 in the array 10. The injection efficiency is very important for scalability to high output power lasers.

In the traditional implementation of the external mirror schemes, the optical coupling between the lasers in the array is very weak. As mentioned in the background, an efficient coupling between the lasers requires about 80% of the output power to be reflected back into the semiconductor laser. In the proposed scheme, a very strong (5-15%) nearest neighbor coupling is achieved automatically. As a result, the coherent output of the cascaded injection laser array 20 can reach 85-95% of the laser array free running output.

For a specific laser array configuration, the positions of the beam sampler 13 and two side mirrors 14, 17 are determined by the incident angle of the injection beam 12. The relationship between the incident angle of the seed beam 12 and the depth of the laser cavity 11a and the diameter of the beam (see FIG. 1a) has been established already. The optimal angle for the injection beam varies typically between six (6) and fifteen (15) degrees, depending on the laser structure.

Without the invention, the cascaded laser array 20 operates in a multiple mode state. With the invention, the performance is increased by parametric optimization that achieves a single mode of laser operation of the whole array. This includes the following elements: 1) an optimal spacing for the next injected laser (in FIG. 1 this number is 2 positions); 2) reflectivity and position of the beam sampler; 3) position of the side high reflectivity mirrors; and 4) periodical patterning of the beam sampler.

There is a possible problem if one of the individual lasers 11 in the array 10 fails to provide the adequate output power needed to inject the next laser emitter 11. At small scale, this problem can be overcome by optimizing the beam sampler reflectivity and/or spatially inhomogeneous reflectivity (patterning) mentioned above. At large scale, this problem can be solved by utilizing a dynamic injection beam array that is available with recently developed beam processing tools. This array is capable of generating an arbitrary array of beams. Under this dynamic control, the failure of individual laser emitters to generate an adequate output power is compensated by injection to the next nearest neighbor laser. Thus, an individual malfunction will not affect the global synchronization stability or the overall array performance.

The laser output beams 18 can be combined in single collimated coherent output beam 42 as shown in FIG. 2. The output beams 18 are directed a lens array 30. From there they are directed to a second beam sampler 32 which reflects a minor portion of each beam to a detector 34. A major portion of each beam is directed through a focusing lens 36 to a spatial filter 40 of a type known in the art. The lens array 30 increases the filling factor of the array of output beams 18, while the spatial filter 40 removes the sideband maxima in the far field pattern (FIG. 2). On the other side of the filter 40, the beams are transmitted through a lens 44 to produce a collimated coherent output beam 42.

A closed loop control of the position of beam sampler 13 and a control of a variable angle of incidence of the injection beam 12 is also shown in FIG. 2. The angle is controlled in response to the output intensity as a feedback parameter using a detector 34 shown in FIG. 2. The detector 34 detects the phase and amplitude of the combined beam and provides this as an input to a personal computer (PC) 50. The PC 50 is connected to a controller 51 which controls the position of the beam sampler 13 through a piezoelectric element 52. The controller 51 also controls the angle of incidence of a master injection laser 54 by controlling an angle of positioning of a reflection mirror 55.

The embodiments of FIGS. 1 and 2 provide a solution for the efficient coupling between the lasers 11 in the array 10. These embodiments reduce the external injection power requirements to the level necessary for locking just one of the lasers of the array. The latter advantage makes it possible to mount the single mode injection laser on the same chip with the laser array and to lock all other broad area lasers by using this single mode seed laser 12.

The cascaded injection laser array 20 provides a closed loop resonator which is needed to obtain collective modes shown in FIG. 2. These collective modes do not (exist?) in the arrangements using an external injection of whole array.

Unlike all known injection locking and external cavity arrangements, the outside seed laser 12 injects just one laser into the array 10. The other lasers 11 in the array 10 are injected by their respective neighbors.

The embodiments of FIGS. 1 and 2 provide a simultaneous frequency/spatial-mode locking and coherent combination of all the laser array beams. The embodiments of FIGS. 1 and 2 provide a high output efficiency by using a fraction of the output power for single mode injection and phase locking of each laser. Indeed, the fraction of the output power needed for injection does not exceed 5-15% of the free running power. This yields an output efficiency of 85-95%. The total dimensions of the proposed assembly 20 is comparable with the dimensions of the laser array itself. The distance between the array and the beam sampler surfaces is within the range of 1-5 mm, which is considerably smaller than the length of all known cascaded injection and external cavity proposals.

Due to these unique features, the proposed construction has the potential to be easily and inexpensively implemented on an integrated single mode laser array chip.

Figure 3:
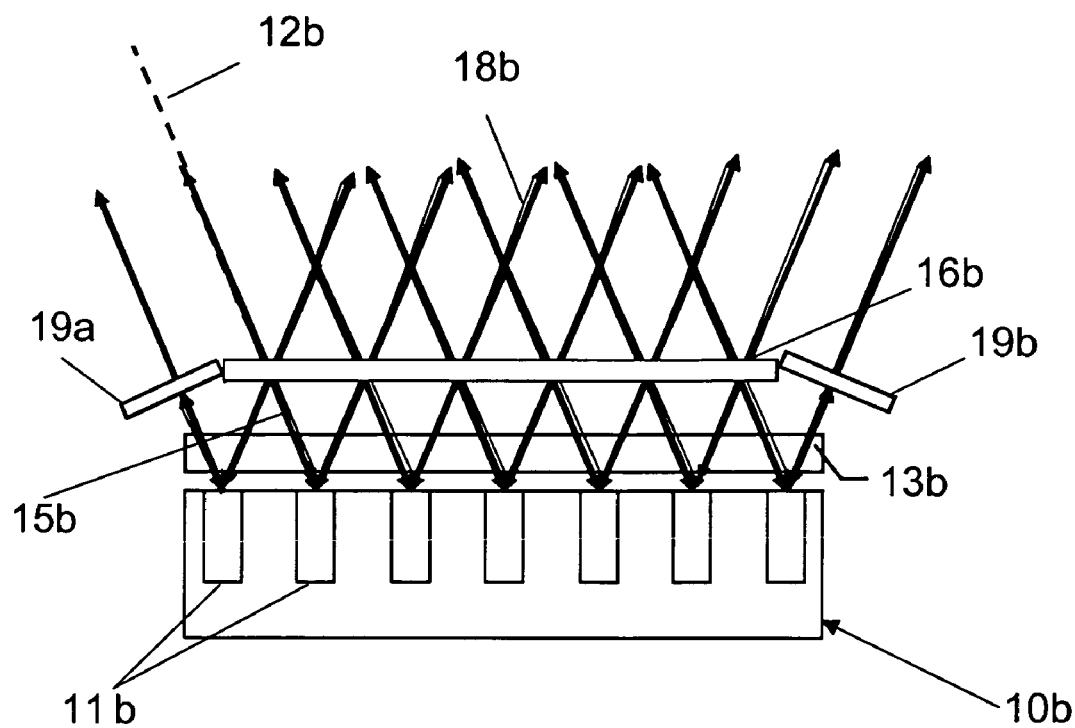
FIG. 3 is a schematic diagram of second embodiment of the invention of FIG. 1.
Figure 4:
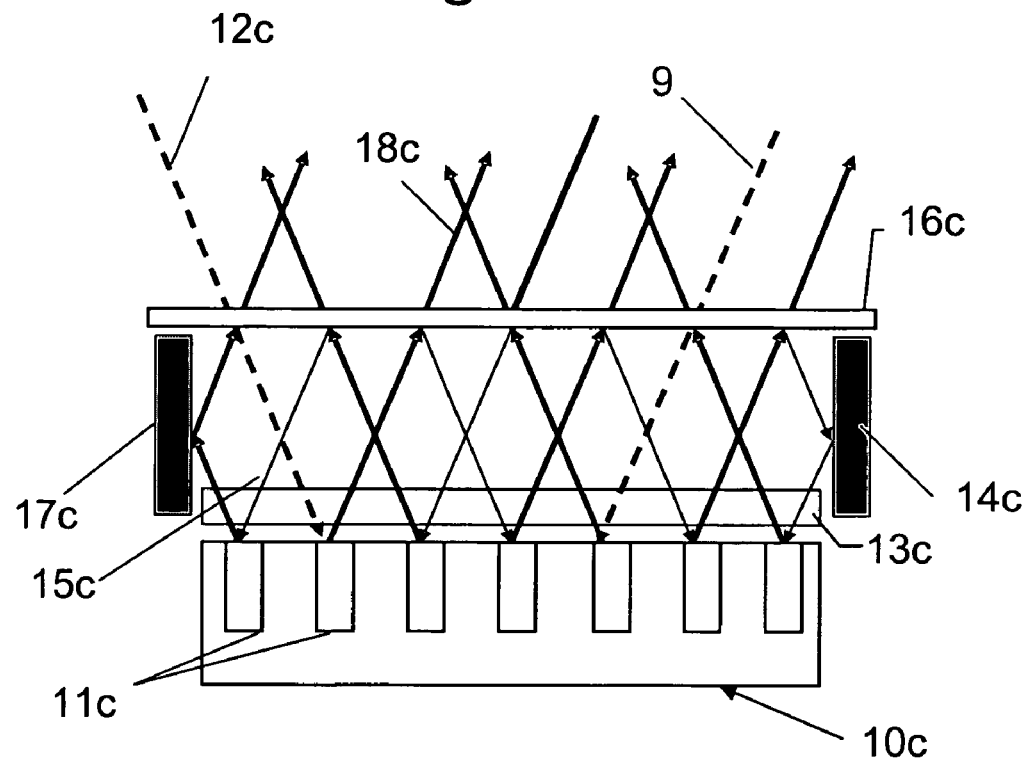
FIG. 4 is a schematic diagram of a third embodiment of FIG. 1.

FIGS. 3 and 4 show an alternative embodiment of the invention. FIG. 3 illustrates the most compact configuration based only on coupling to each next laser emitter 11b in the array 10b by moving the beam sampler 13a closer to the collimating lens 16a. In this configuration, each laser 11b in the array 10b is injected in two opposite directions and operated in two modes to generate two lasers 15b instead of a single laser as in the examples described above. The side high reflectivity mirrors are replaced with beam splitters 19a, 19b which have the same ratio of reflection to transmission as the beam sampler 13b.

FIG. 4 shows the version where two injection beams are used for seeding the array. The parts of the embodiment in FIG. 4 correspond to parts with the same numbers as in FIG. 1, except that a "c" suffix has been added to the corresponding elements in FIG. 4. The one additional element is the second injection laser 9 coming in from an opposite side at an angle of incidence having an opposite incidence angle of the first injection beam 12. This arrangement provides better outside control, though it involves more sophisticated dynamics.

Figure 5:
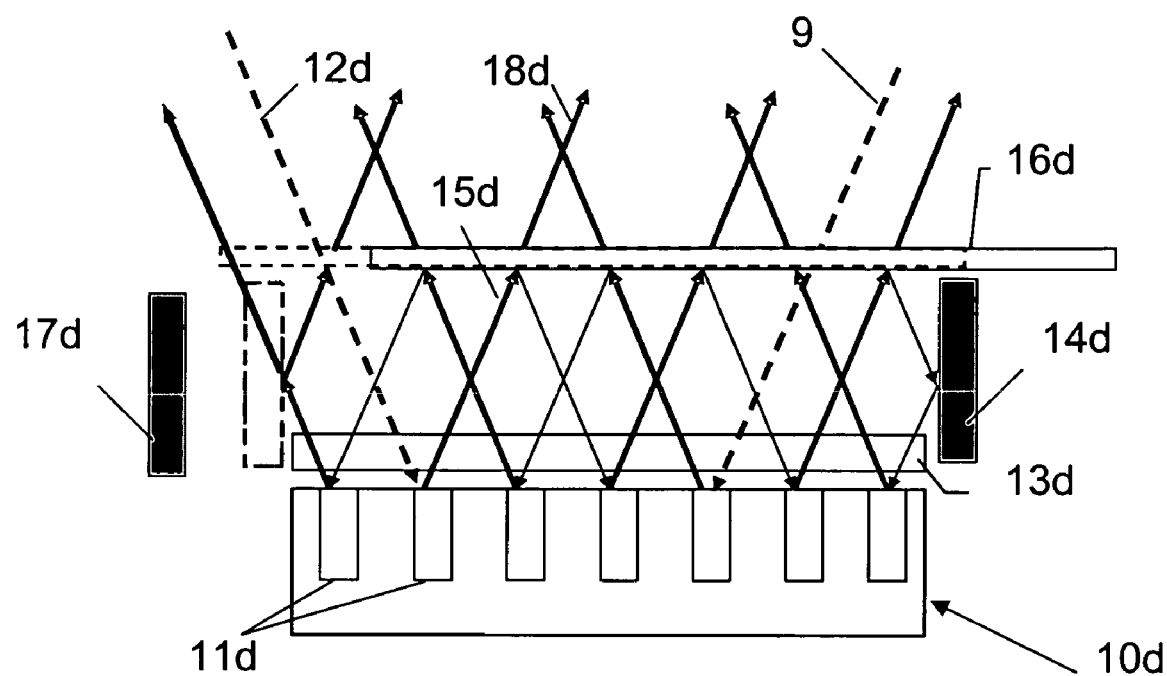
FIG. 5 is a schematic diagram of an open loop variation of the embodiment of FIG. 1.

FIG. 5 illustrates an open-loop cascaded injection array 20d. The parts of the embodiment in FIG. 5 correspond to elements with the same numbers as in FIG. 1, except that a "d" suffix has been added to the corresponding elements in FIG. 5. This configuration can be obtained from closed-loop cascaded injection scheme ether by shifting of the beam sampler 13d or by removing one of the side mirrors 17d. This approach could be advantageous for some applications or specific array configuration.

Although the detailed embodiments herein have been described in terms of utilizing a semiconductor laser, the invention can be employed with semiconductor lasers or with lasers of other types such as fiber lasers, solid state lasers or other laser systems where synchronization of array can improve performance, power or thermo management.

This has been a description of the preferred embodiments, but it will be apparent to those of ordinary skill in the art that variations may be made in the details of these specific embodiments without departing from the scope and spirit of the present invention, and that such variations are intended to be encompassed by the following claims.

We claim:

1. A method of combining beams from a plurality of laser emitters into a single mode, single frequency, coherent output beam, the method comprising:

arranging a plurality of laser emitters along at least one plane and facing in one direction in an arrangement having first and second lateral ends;

injecting an initial laser beam into one of the plurality of laser emitters to begin a sequence of generating and reflecting a laser beam between laser emitters, such that the laser beam travels to others in the plurality of the laser emitters;

reflecting at least a portion of a laser beam from each of the laser emitters back to another one of the laser emitters to cause a beam to be generated from the other one of the laser emitters;

transmitting another portion of the laser beam from each of the laser emitters to produce a laser output beam;

wherein a plurality of laser output beams having a single laser mode are generated from the respective laser emitters; and combining the plurality of laser output beams into a single mode, single frequency, coherent output beam.

2. The method as recited in claim 1, further comprising:

reflecting a laser beam received at one lateral end of the plurality of laser emitters back to one of the plurality of laser emitters to reverse a lateral direction of travel of the laser beam after the laser beam has been reflected a plurality of times; and reflecting the laser beam when received at an opposite lateral end of the plurality of laser emitters back to one of the plurality of laser emitters to reverse a lateral direction of travel of the laser beam after the laser beam has been reflected a plurality of times to close a loop of travel for the laser beam.

3. The method as recited in claim 1, wherein the plurality of laser emitters operate as a resonator in injecting the beam into another one of the laser emitters in sequence.

4. The method as recited in claim 3, wherein the plurality of laser emitters operates as a closed loop feedback system.

5. The method as recited in claim 1, wherein each laser emitter in the plurality of laser emitters is injected in two opposite directions and is operated to generate two lasers in two respective modes instead of a single mode; and wherein said two lasers are transmitted through beam splitter disposed on opposite ends of the plurality of lasers.

6. The method as recited in claim 5, further comprising injecting a second laser beam into one of the plurality of lasers at an equal but opposite angle of incidence to the angle of incidence of the initial laser beam begin a sequence of generating and reflecting a laser beam between laser emitters, such that the laser beam travels to others in the plurality of the laser emitters.

7. The method as recited in claim 1, wherein the plurality of laser emitters is operated as an open loop system without feedback.

8. The method as recited in claim 1, further comprising:

directing the plurality of output laser beams to a lens array; and directing the plurality of output laser beams through a spatial filter to remove sideband maxima and to produce a single collimated coherent laser beam at a single frequency and single spatial mode.

9. The method as recited in claim 1, further comprising detecting output power of the combined laser output beam;

controlling a position of a beam sampler in response to the output power of the laser beams.

10. The method as recited in claim 1, further comprising:

detecting output power of the combined laser output beam;

controlling an angle of incidence of the initial laser beam in response to the output power of the combined laser output beam.

11. A multiple-laser device for production of a single mode, coherent beam output beam, the device comprising:
- a plurality of laser emitters aligned along at least one plane;
- a beam sampler for reflecting at least a portion of a laser beam that impinges on the beam sampler, said portion of the laser beam from one of the laser emitters being reflected back to another one of the laser emitters to cause a beam to be generated from the other one of the laser emitters to the beam sampler;
- wherein said beam sampler also transmits a portion of said laser beam to produce a laser output beam; and
- an injection laser beam directed to a first laser emitter to begin a process of generating and reflecting a laser beam from one laser emitter to another laser emitter in the plurality; and
- wherein a plurality of laser output beams are produced having a same frequency and phase.

12. The laser device as recited in claim 11, further comprising:
- at least two mirrors arranged on opposite sides of the plurality of laser emitters so as to each reflect a beam reflected from the beam sampler to one of the laser emitters while reversing a direction of lateral travel of the laser beam between laser emitters in the plurality.

13. The laser device as recited in claim 11, wherein the plurality of laser emitters operate as a resonator in injecting a beam into another one of said laser emitters in a sequence.

14. The laser device as recited in claim 11, wherein the plurality of laser emitters operates as a closed loop feedback system.

15. The laser device as recited in claim 11, further comprising:
- at least one mirror arranged at one end of the plurality of laser emitters so as to each reflect a beam reflected from the beam sampler to one of the laser emitters while reversing a direction of lateral travel of the laser beam between laser emitters in the plurality.

16. The laser device as recited in claim 11, further comprising:
- at least two beam samplers disposed at opposite ends of the plurality of lasers each allowing a laser beam to pass therethrough.

17. The laser device as recited in claim 11, wherein each laser emitter in the plurality of laser emitters is injected in two opposite directions and is operated to generate two lasers in two respective modes instead of a single mode.

18. The laser device as recited in claim 11, further comprising injecting a second laser beam into one of the plurality of lasers at an equal but opposite angle of incidence to begin a sequence of generating and reflecting a laser beam between laser emitters, such that the laser beam travels to other laser emitters in the plurality.

19. The laser device as recited in claim 11, further comprising:
- a plurality of lenses for receiving the plurality of output laser beams and re-directing the output laser beams on parallel paths; and
- a spatial filter for receiving the output laser beams to remove sideband maxima and to produce a single collimated coherent laser beams at a single frequency and a single spatial mode.

20. The laser device as recited in claim 11, further comprising:
- a detector for detecting output power of the combined laser beam; and
- a controller for controlling a position of a beam sampler in response to the output power of the combined laser output beam.

21. The laser device as recited in claim 11, further comprising:
- a detector for detecting output power of the combined laser output beam; and
- a controller for controlling an angle of incidence of the injection laser beam in response to the detected output power of the combined laser output beam.

22. The laser device as recited in claim 11, wherein the laser emitters are semiconductor lasers.

* * * * *